(12) United States Patent
Wehlus et al.

(10) Patent No.: US 9,978,993 B2
(45) Date of Patent: May 22, 2018

(54) ORGANIC LIGHT-EMITTING DIODE AND METHOD FOR PRODUCING AN ORGANIC LIGHT-EMITTING DIODE

(71) Applicant: OSRAM OLED GmbH, Regensburg (DE)

(72) Inventors: Thomas Wehlus, Lappersdorf (DE); Daniel Riedel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days. days.

(21) Appl. No.: 15/489,122

(22) Filed: Apr. 17, 2017

(65) Prior Publication Data

US 2017/0352838 A1    Dec. 7, 2017

(30) Foreign Application Priority Data

Apr. 18, 2016    (DE) .................. 10 2016 107 118

(51) Int. Cl.
*H01L 51/50* (2006.01)
*H01L 51/52* (2006.01)
*H01L 51/56* (2006.01)

(52) U.S. Cl.
CPC ...... *H01L 51/5268* (2013.01); *H01L 51/5212* (2013.01); *H01L 51/56* (2013.01); *H01L 2251/5369* (2013.01)

(58) Field of Classification Search
CPC ............. H01L 51/5203; H01L 51/5268; H01L 51/5209; H01L 51/5212; H01L 51/5215; H01L 51/5225; H01L 51/5228; H01L 51/5234; H01L 2251/5369
See application file for complete search history.

(56) References Cited

U.S. PATENT DOCUMENTS

| 2011/0001153 A1 | 1/2011 | Tchakarov et al. |
| 2011/0031474 A1* | 2/2011 | Bechtel .................. H05B 33/14 257/40 |
| 2014/0008620 A1 | 1/2014 | Morohashi et al. |
| 2015/0282311 A1* | 10/2015 | Lovenich .............. H01L 51/445 257/40 |

(Continued)

FOREIGN PATENT DOCUMENTS

| DE | 102005002837 A1 | 8/2006 |
| DE | 102013005763 A1 | 10/2014 |
| DE | 102015104793 A1 | 9/2016 |

*Primary Examiner* — Robert Bachner
*Assistant Examiner* — Molly Reida
(74) *Attorney, Agent, or Firm* — Slater Matsil, LLP

(57) ABSTRACT

In one embodiment the organic light-emitting diode includes a substrate having a substrate upper side, an electrically conductive grid structure for a current distribution and an electrically conductive particle layer, which are located at the substrate upper side. The grid structure may be embedded in the particle layer. An organic layer sequence for generating the radiation is located directly on the particle layer. A covering electrode is attached to the organic layer sequence. The particle layer comprises scattering particles having a first average diameter and electrically conductive particles having a smaller second average diameter. The scattering particles are densely packed together with the conductive particles. The particle layer forms, together with the grid structure, a substrate electrode for the organic layer sequence.

15 Claims, 5 Drawing Sheets

(56) References Cited

U.S. PATENT DOCUMENTS

2016/0197314 A1* 7/2016 Yoon .................. H01L 51/5206
                                                          438/27
2017/0125722 A1* 5/2017 Wehlus ............... H01L 51/5212

* cited by examiner

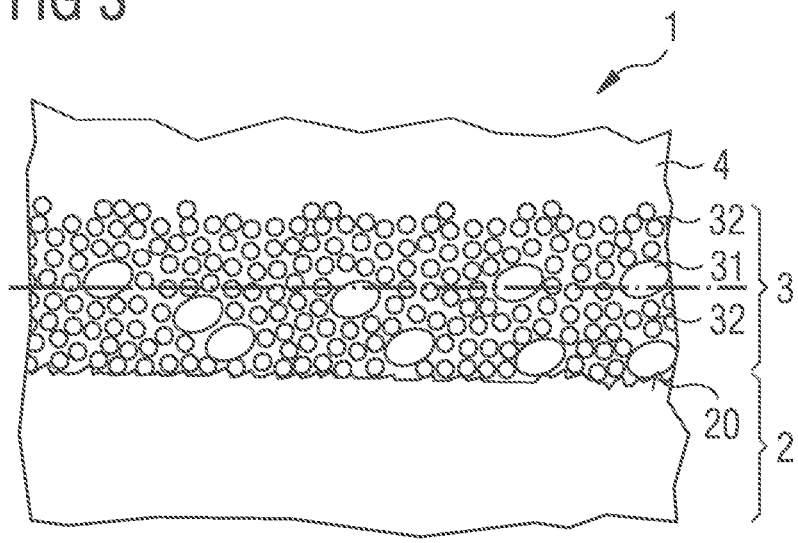
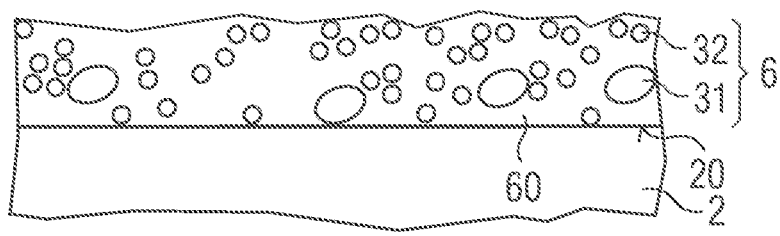
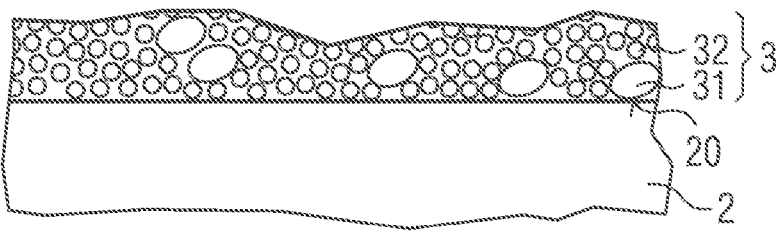

ORGANIC LIGHT-EMITTING DIODE AND METHOD FOR PRODUCING AN ORGANIC LIGHT-EMITTING DIODE

This patent application claims the priority of German patent application 10 2016 107 118.8, filed Apr. 18, 2016, which is incorporated herein by reference in its entirety.

TECHNICAL FIELD

An organic light-emitting diode is described. A method for producing an organic light-emitting diode is moreover described.

SUMMARY OF THE INVENTION

Embodiments of the invention provide an organic light-emitting diode which homogeneously emits light efficiently over a relatively large surface.

According to at least one embodiment the organic light-emitting diode is equipped for generating visible light. For example, the organic light-emitting diode emits blue, green, yellow, orange or red light. It is equally possible for light of blended colour, in particular white light, to be emitted by the organic light-emitting diode when used as intended.

According to at least one embodiment the organic light-emitting diode comprises a substrate. The substrate has a substrate upper side. The substrate can be the mechanically supporting and stabilising component of the organic light-emitting diode. The substrate can be mechanically rigid or also mechanically flexible and therefore bendable in configuration.

According to at least one embodiment an electrically conductive grid structure is located on the substrate upper side. The grid structure is equipped to ensure a divergence of the current and a uniform lateral current distribution over the substrate. Grid structure means in particular that, seen in plan view on the substrate upper side, a multiplicity of honeycombs is formed, so that a material of the grid structure surrounds the honeycombs completely, an inner space of the honeycombs being free from the material of the grid structure. The grid structure can be applied directly to the upper side. Alternatively, a further layer can be located between the substrate and the grid structure, in particular for better adhesion of the grid structure to the substrate. Such a grid structure is also called busbars.

According to at least one embodiment the light-emitting diode comprises a particle layer. The particle layer is electrically conductive, at least in a direction perpendicular to the substrate upper side, preferably both in the direction perpendicular and in the direction parallel to the substrate upper side.

According to at least one embodiment the particle layer is located directly on the substrate upper side. In other words, a material of the particle layer then touches the substrate upper side and a material of the substrate. Preferably, the particle layer and the substrate upper side touch over the entire surface.

According to at least one embodiment the grid structure is embedded in the particle layer. This means that the particle layer completely or partially covers the grid structure on side faces which are orientated transversely to the substrate upper side. In the direction parallel to the substrate upper side the particle layer is located directly on the grid structure.

According to at least one embodiment an organic layer sequence is attached to the particle layer. Preferably, the organic layer sequence is located immediately and directly on the particle layer. The organic layer sequence comprises at least one layer which is based on at least one organic material and which is equipped for generating the radiation, in particular light. The organic layer sequence can have further layers, such as charge carrier injection layers, charge carrier transport layers, charge carrier barrier layers and/or charge carrier generation layers.

According to at least one embodiment the organic light-emitting diode comprises a covering electrode. The covering electrode is attached to the organic layer sequence. That is to say, the covering electrode is located on a side of the organic layer sequence facing away from the substrate. It is possible for the covering electrode to be located directly and immediately on the organic layer sequence.

According to at least one embodiment the particle layer has scattering particles. The scattering particles are equipped for light scattering. In particular, scattering of the light generated in the organic layer sequence when the organic light-emitting diode is used as intended takes place via the scattering particles. An increased light outcoupling efficiency of light from the organic light-emitting diode can be achieved via the scattering particles. That is to say, the particle layer can be interpreted overall as a light-scattering layer and therefore as a scattering layer. The particle layer then simultaneously has two main functions, namely light scattering and current conduction.

According to at least one embodiment the particle layer comprises a multiplicity of conductive particles. The conductive particles are electrically conductive. The electrical conductivity of the particle layer is determined and adjusted substantially via the conductive particles. A number of the conductive particles exceeds a number of the scattering particles, for example, by at least a factor of 10 or $10^3$ or $10^5$.

According to at least one embodiment the scattering particles have a first average diameter and the conductive particles have a second average diameter. The second average diameter is smaller than the first average diameter. Preferably, the conductive particles are so-called nanoparticles, that is to say particles having an average diameter of at most 100 nm. Further preferably, the scattering particles are microparticles, that is to say particles having an average diameter of between 0.1 µm and 10 µm inclusive. Average diameter is understood as meaning in particular the diameter $d_{50}$ in $Q_0$.

According to at least one embodiment the scattering particles are present in the particle layer densely packed together with the conductive particles. Densely packed means preferably that a packing density and a volume fill is in the order of magnitude of the densest sphere packing for spheres of equal size. For example, the volume fill in the particle layer by the scattering particles together with the conductive particles is at least 67% or 70% or 75% or 80% or 85% or 90% or 95%. A packing density above the densest sphere packing for spheres of equal size can be achieved by the scattering particles and the conductive particles having different average diameters.

According to at least one embodiment a volume content of the scattering particles in the particle layer is at most 50%, or 30% or 15% or 10% or 8%.

According to at least one embodiment the grid structure forms, together with the particle layer, a substrate electrode for the organic layer sequence. This means that the organic layer sequence is supplied with current by means of the substrate electrode together with the covering electrode. The organic layer sequence in this context is preferably directly adjacent to the substrate electrode and/or to the covering electrode over the entire surface.

In at least one embodiment the organic light-emitting diode comprises a substrate having a substrate upper side, an electrically conductive grid structure for a current distribution and an electrically conductive particle layer, which are applied to the substrate upper side. The grid structure here is embedded in the particle layer. An organic layer sequence for generating the radiation is located directly on the particle layer. A covering electrode is attached to the organic layer sequence. The particle layer comprises scattering particles having a first average diameter and electrically conductive particles having a smaller, second average diameter. The scattering particles are present in the particle layer densely packed together with the conductive particles. The particle layer forms, together with the grid structure, a substrate electrode for the organic layer sequence.

In order to achieve an efficient light outcoupling from an organic light-emitting diode, OLED for short, particle layers are conventionally used. Such particle layers are as a rule formed from scattering particles which are embedded in an electrically insulating matrix. The matrix is then formed, for example, from a glass or a polymer. Such a particle layer which overall is electrically insulating is in general located between a substrate and an anode. The production of such particle layers which lie between a substrate and an anode, however, is comparatively expensive. In addition, such particle layers often have only a relatively low electrical conductivity, which limits a maximum achievable size of an organic light-emitting diode.

By the electrically conductive particle layer described here, in combination with the grid structure, it is possible either to dispense with a separate anode entirely, or to arrange the particle layer directly on a side of the anode facing away from the substrate. By this means the production of the particle layer, in particular also in view of the production of the anode, is simplified, and at the same time efficiently and homogeneously emitting organic light-emitting diodes of large surface can be achieved.

According to at least one embodiment the particle layer and the grid structure end flush with one another in the direction away from the substrate upper side. A flat surface can thus be formed by the grid structure and the particle layer taken together, to which the organic layer sequence is applied. The organic layer sequence in this case can touch both the grid structure and the particle layer. An injection of current into the organic layer sequence in this context preferably takes place only via the particle layer and not via the grid structure. In other words, an electric current is distributed over the grid structure, injected locally into the particle layer and then conducted by the particle layer into the organic layer sequence.

According to at least one embodiment the particle layer protrudes over the grid structure in the direction away from the substrate upper side. In this context it is possible that the particle layer covers the grid structure completely or also only partially. Alternatively, the grid structure can be free from the particle layer on a side facing away from the substrate.

According to at least one embodiment the particle layer forms a flat, continuous surface above the grid structure. The organic layer sequence is applied immediately on this surface. The organic layer sequence in this case is at a distance from the grid structure.

According to at least one embodiment the particle layer and the grid structure have the same or approximately the same thickness. For example, equal thicknesses are present with a tolerance of at most 30% or 20% or 10%, based on a thickness of the grid structure. In the case where the particle layer protrudes over the grid structure the particle layer above the grid structure is then only comparatively thin.

According to at least one embodiment a degree of covering of the substrate upper side by the grid structure is at least 3% or 10% or 20%. Alternatively or in addition, the degree of covering is at most 60% or 30% or 25% or 15%. That is to say, a relatively large proportion of the surface of the substrate upper side is covered by the grid structure.

According to at least one embodiment the grid structure comprises one or more metallic layers or consists of one or more metallic layers. For example, the grid structure comprises three metallic layers, two adhesion promotion layers and a current conduction layer in particular then being present.

According to at least one embodiment the grid structure has crosspieces which border meshes. An average line width of the grid structure and/or an average width of the crosspiece, in particular seen in plan view on the substrate upper side, in this context is preferably at least 1 µm or 2 µm or 5 µm or 10 µm or 20 µm and/or at most 200 µm or 120 µm or 70 µm or 40 µm or 15 µm. In particular, the crosspieces are narrow such that the crosspieces are not detectable with the naked human eye when the organic light-emitting diode is used as intended.

According to at least one embodiment an average mesh width of the grid structure is at least 0.1 mm or 0.5 mm or 0.8 mm. Alternatively or in addition, the average mesh width is at most 5 mm or 3 mm or 1.5 mm or 1 mm. The average mesh width is in particular an average diameter of the meshes, seen in plan view on the substrate upper side.

According to at least one embodiment the grid structure has a thickness of at least 100 nm or 200 nm or 300 nm or 500 nm. Alternatively or in addition, the thickness of the grid structure is at most 10 µm or 5 µm or 1 µm or 0.4 µm. Corresponding circumstances preferably apply to the thickness of the particle layer.

According to at least one embodiment the grid structure, seen in plan view, is formed by a triangular, rectangular, pentagonal, hexagonal or octagonal pattern. In other words, the meshes are configured as triangles, rectangles, pentagons, hexagons and/or octagons. The patterns and the meshes in this context are preferably arranged regularly.

Alternatively, the grid structure can also be configured irregularly and/or in statistical distribution and/or randomly. In this context a triangular, rectangular, pentagonal, hexagonal or octagonal base pattern which is modified and/or altered can be present.

According to at least one embodiment the crosspieces of the grid structure, seen in cross-section, are rectangular in shape. Alternatively, it is possible for the crosspieces, seen in cross-section, to narrow in the direction away from the substrate upper side. In this case the crosspieces, seen in cross-section, are, for example, triangular, trapezoidal, semicircular, trapezoidal, hyperbolic and/or parabolic in configuration.

According to at least one embodiment a surface conductivity of the substrate electrode is at least 1 mS·☐ or 0.1 S·☐ or 1 S·☐ or 4 S·☐. Alternatively or in addition, the surface conductivity is at most 100 S·☐ or 20 S·☐ or 10 S·☐. The surface conductivity here is preferably constant or approximately constant over the substrate electrode.

According to at least one embodiment an emitting surface of the organic light-emitting diode is comparatively large. The emitting surface in this context is in particular a cohesive surface which is not divided functionally into smaller units. In particular, the emitting surface is at least 0.01×0.01 m² or 0.05×0.05 m² or 0.1×0.1 m² and/or at most 1×1 m² or 0.7×0.7 m² or 0.3×0.3 m².

According to at least one embodiment the scattering particles and the conductive particles are produced from materials which differ from one another. In particular, a difference between the refractive indices of the materials of the scattering particles and of the conductive particles is at least 0.1 or 0.2 or 0.3. The refractive indices are preferably based on a wavelength of maximum intensity of the radiation generated by the light-emitting diode when used as intended and on room temperature.

According to at least one embodiment the average diameters of the conductive particles and the scattering particles differ by at least a factor of 1.5 or 2 or 3 or 5 or 10. Preferably, the conductive particles and alternatively or in addition also the scattering particles have a relative wide diameter distribution. This can mean that at most 50% or 65% of the conductive particles have a diameter which is between 50% and 150% of the average diameter of the particular particles. By a relatively wide diameter distribution in particular of the conductive particles a particularly dense packing can be achieved in the particle layer.

According to at least one embodiment the substrate is formed homogeneously from only one single material. In particular, the substrate is then an electrically insulating substrate. Specifically, in this case the substrate upper side is electrically insulating in construction. In particular, it is possible for the substrate to be free from scattering particles or scattering centres.

According to at least one embodiment the particle layer of the light-emitting diode comprises the scattering particles and the conductive particles. That is to say, no matrix material in which the scattering particles and the conductive particles are embedded is then present. The term "comprises" in this context refers only to solids and liquids. It is thus possible for evacuated hollow spaces or small intermediate spaces which are filled with a gas to be located between the particles of the particle layer. If gas-filled intermediate spaces are present, these intermediate spaces are preferably filled with an inert gas, such as nitrogen or argon. In the case of the presence of such a gas, the pressure of this gas at room temperature is preferably not or not significantly above normal pressure.

According to at least one embodiment the average diameter of the scattering particles is at least 50 nm or 100 nm or 150 nm. Alternatively or in addition, this average diameter is at most 2 µm or 1 µm or 0.4 µm. Furthermore, the conductive particles preferably have an average diameter of at least 2 nm or 5 nm or 10 nm and/or of at most 100 nm or 50 nm or 20 nm.

According to at least one embodiment the scattering particles are produced from an electrically insulating material. In particular, the scattering particles have one or more of the following materials or consist of one or more of these materials: $TiO_2$, $Ta_2O_5$, $ZrO_2$, $CrO_2$, AlN, and $SiO_2$.

According to at least one embodiment the scattering particles are also produced from an electrically conductive material. In particular, the scattering particles are then produced from a transparent conductive oxide, TCO for short, having a relatively high optical refractive index.

According to at least one embodiment the particle layer has two or more than two sublayers which differ from one another with respect to their optical properties. In particular, one of the sublayers is more highly scattering for light in construction than a further sublayer.

According to at least one embodiment the particle layer has a first sublayer which is located directly on the substrate upper side. In the first sublayer a higher concentration of the scattering particles is present than in a second sublayer of the particle layer, the second sublayer being located directly on the organic layer sequence. For example, a concentration of the scattering particles in the sublayers differs by at least a factor of 2 or 3 or 5 or 10. In particular, it is possible for the second sublayer to be free from the scattering particles and/or to comprise only the conductive particles.

In the first sublayer the scattering particles are preferably distributed homogeneously and statistically. Alternatively, it is possible for the scattering particles, relatively to the conductive particles, to be sedimented to a greater degree in the entire particle layer or in the first sublayer and to display an increasing concentration in the direction of the substrate upper side.

According to at least one embodiment an average roughness of a main side of the particle layer facing away from the substrate is at most 50 nm or 25 nm or 15 nm or 10 nm. It is possible for the average roughness, also called $R_a$, to be less than 25% or 10% of the average diameter of the scattering particles. In particular, the average roughness is at most 50% or 100% of the average diameter of the conductive particles.

According to at least one embodiment the substrate upper side has an average roughness which is at most 15 nm or 10 nm or 5 nm. In particular, the average roughness of the main side of the particle layer facing away from the substrate is greater by at most a factor of 3 or 2 or 1.5 than the average roughness of the substrate upper side.

According to at least one embodiment the conductive particles are percolated in the particle layer. In other words, a continuous path in particular for current conduction is then formed in the particle layer by the conductive particles. It is possible for exclusively the conductive particles and therefore not the scattering particles to be percolated. That is to say, no cohesive paths are then constructed by the scattering particles alone.

According to at least one embodiment the light-emitting diode emits the light generated in the light-emitting diode partially or completely through the particle layer and through the substrate when operated as intended. In this context it is possible for the light-emitting diode to emit light only on a single main side on which the substrate is located.

According to at least one embodiment the volume content of the scattering particles in the particle layer is at least 1.5% or 3% or 5%. Alternatively or in addition, this volume content is at most 20% or 15% or 10%. Preferably, a volume content of between 5% and 10% inclusive is present.

According to at least one embodiment the particle layer is free or substantially free from organic materials. This can mean that the particle layer comprises inorganic materials to the extent of at least 90% by weight or 95% by weight or 98% by weight. In particular, the functionality of the particle layer, that is to say the scattering action and the electrical conductivity, is due exclusively to inorganic materials. The high content of inorganic materials is achieved in particular by the particle layer being free from a matrix material for the scattering particles or the conductive particles. By the predominant use of inorganic materials an increased life and resistance to external environmental influences exists.

According to at least one embodiment the thickness of the substrate electrode is constant, in particular with a tolerance of at most 50% or 25% or 10% of the average diameter of the scattering particles.

According to at least one embodiment the covering electrode is a metallic electrode. In particular, the covering electrode is configured as a metallic mirror and has as the main component, for example, aluminium, silver and/or gold or comprises a metal alloy of these or of the materials mentioned.

According to at least one embodiment in the switched-off state the light-emitting diode appears milky-cloudy and/or whitish to an observer. This colour impression of the switched-off light-emitting diode is caused in particular by the particle layer.

A method for producing an organic light-emitting diode is moreover described. With the method, an organic light-emitting diode is produced, as described in connection with one or more of the abovementioned embodiments. Features of the method are therefore also disclosed for the organic light-emitting diode and vice versa.

In at least one embodiment the method comprises the following steps: A) providing the substrate with the substrate upper side, B) generating the grid structure on the substrate upper side, C) preparing a solution which comprises at least a solvent, the scattering particles and the conductive particles or consists of these, D) applying the solution to the substrate upper side, so that the grid structure is embedded by the solution and by the finished particle layer, E) drying the solution by removing the solvent and therefore forming the particle layer, and F) applying the organic layer sequence to the particle layer.

With the exception of step C), which can also be carried out before steps A) and B), the individual steps are preferably carried out in the sequence stated.

The solvent is in particular a solvent which evaporates without residue, for example, by increasing the temperature and/or lowering the pressure. The solvent is formed, for example, by an alcohol, an alkane, an alkene, a benzene, an ether, a ketone, a lactone, a lactam, a nitrile, a sulphoxide, or a sulphone or by mixtures of these. For example, the solvent is isopropanol, ethanol, acetone, 1-methoxy-2-propanol or mixtures of these.

According to at least one embodiment the solution is applied via ink jet printing, a slot die method, via screen printing or knife coating. Via such application methods it is possible for the particle layer to be applied only locally and therefore in a structured form.

According to at least one embodiment the grid structure is applied in a structured form by a printing method, such as ink jet printing. A subsequent removal of previously applied material of the grid structure can be avoided by this means. Alternatively, the grid structure is first applied over the entire surface, for example, vapour-deposited, also in several layers, and subsequently structured, for example, by photolithography.

BRIEF DESCRIPTION OF THE DRAWINGS

An organic light-emitting diode described here and a method described here are explained in more detail with the aid of exemplified embodiments in the following with reference to the drawing. The same reference symbols in this context indicate the same elements in the individual figures. However, no relationships to scale are presented in this context, rather, individual elements may be shown in exaggerated size for better understanding.

The figures show:

FIGS. 3 and 5 show section diagrams of exemplified embodiments of organic light-emitting diodes, FIGS. 4A-4B show section diagrams of method steps of a method described here for producing an organic light-emitting diode.

DETAILED DESCRIPTION OF ILLUSTRATIVE EMBODIMENTS

Figure 1A:
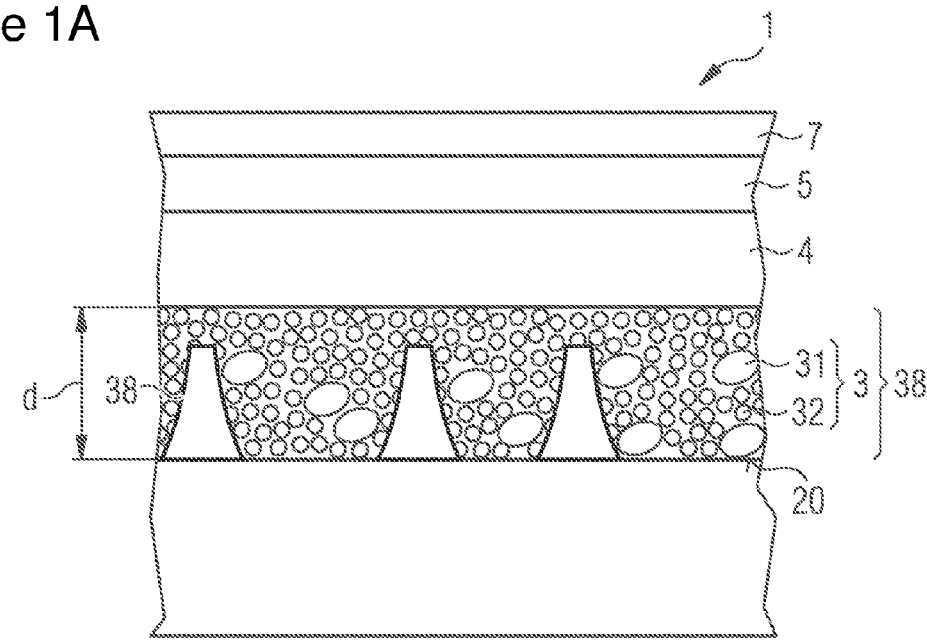
FIGS. 1A-1B show a section diagram and a plan view diagram of an exemplified embodiment of an organic light-emitting diode.
Figure 1B:
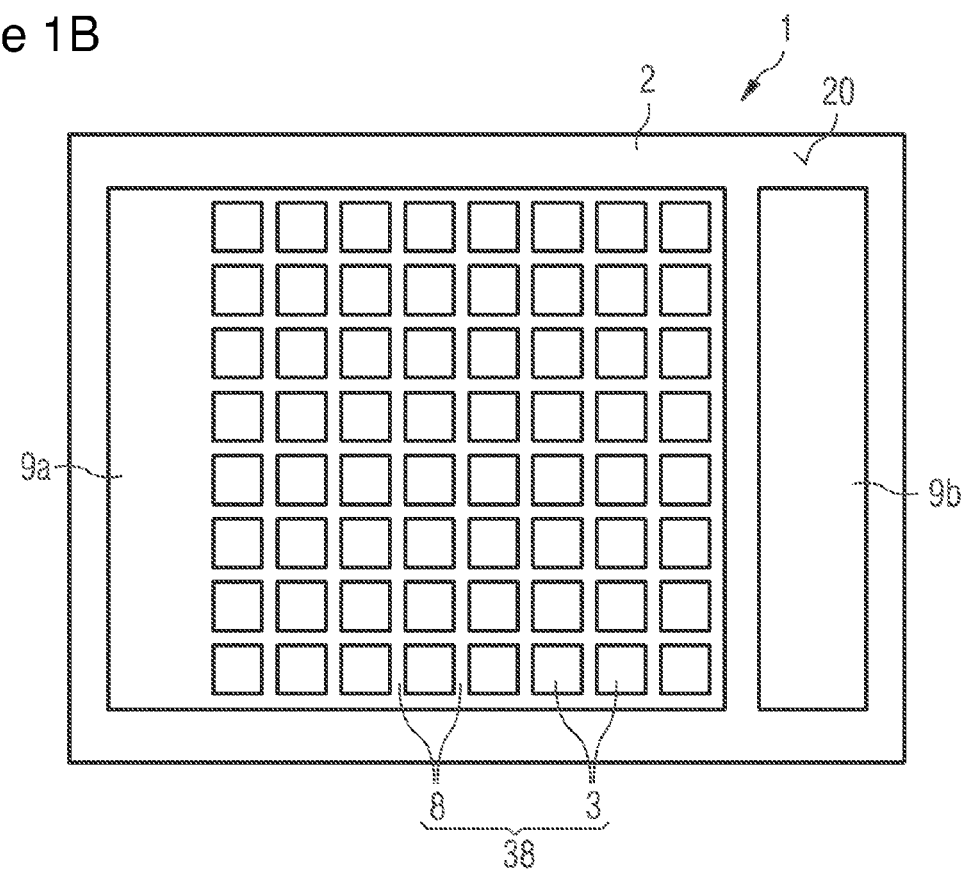

FIG. 1 shows an exemplified embodiment of an organic light-emitting diode 1. The light-emitting diode 1 has a substrate 2 having a substrate upper side 20. The transparent, electrically insulating substrate 2 comprises, for example, a glass base body on which an electrically conductive grid structure 8 is applied directly.

Immediately on the substrate upper side 20 there is moreover located a particle layer 3, in which the grid structure 8 is installed. In the direction away from the substrate upper side 20 the particle layer 3 protrudes over the grid structure 8. The grid structure 8 moreover is completely covered by the particle layer 3. The grid structure 8, seen in cross-section, is trapezoidal, see FIG. 1A. Seen in plan view, the grid structure 8 is configured as a regular, square grid, see FIG. 1B.

The particle layer 3 is composed of comparatively large scattering particles 31, which are equipped for light scattering. The particle layer 3 furthermore comprises a multiplicity of conductive particles 32 which are produced from an electrically conductive and transparent material, such as ITO. A material of the scattering particles 31 is, for example, electrically insulating titanium dioxide. Due to the refractive index differences between the scattering particles 31 and the conductive particles 32, the scattering particles 31 have a light-scattering action.

In the particle layer 3 the conductive particles 32 are densely packed together with the scattering particles 31, as is also the case in all other exemplified embodiments. In particular, the particle layer 3 is free from a matrix material. Since the conductive particles 32 are present in the particle layer 3 in percolated form and are made of an electrically conductive material, the particle layer 3 overall is electrically conductive. A thickness d of the particle layer 3 is, for example, between 300 nm and 800 nm inclusive, in particular approximately 470 nm.

An organic layer sequence 4 is applied immediately on the particle layer 3. The organic layer sequence 4 is shown only in a very simplified form. The organic layer sequence 4 comprises at least one active zone for generating light. This light generated in the active zone 4 is scattered at the scattering particles 31, as a result of which a light outcoupling efficiency of the light from the light-emitting diode 1 is increased.

A covering electrode 5 is applied directly on the organic layer sequence 4. The covering electrode 5 is preferably a metallic layer or a metallic layer system. A mirror for the radiation generated in the organic layer sequence 4 is realised by the covering electrode 5. An injection of current into the organic layer sequence 4 takes place by means of the particle layer 3 and the covering electrode 5, both of which are produced from inorganic materials.

The particle layer 3 together with the grid structure 8 form a substrate electrode 38. By the grid structure 8 a lateral current distribution is effected over the substrate upper side 20. An injection of current into the organic layer sequence 4 takes place in this context via the particle layer 3. Due to the grid structure 8, which has a comparatively high electrical conductivity, light-emitting diodes 1 of large surface can be achieved. Furthermore, due to the grid structure 8 the thickness d of the substrate electrode 38 is relatively small, as a result of which a high transparency of the substrate electrode 38 can be realised.

The substrate electrode 38 can be connected electrically via an electrical contact surface 9a. Corresponding circumstances apply to the covering electrode 5 with respect to the electrical contact surface 9b. The contact surfaces 9a, 9b are preferably located outside the encapsulation layer 7.

An encapsulation layer 7 is optionally located on a side of the covering electrode 5 facing away from the substrate 2. In contrast to that shown, the encapsulation layer 7 can also be composed of several sublayers. Further components of the organic light-emitting diode 1, such as electrical terminal areas, current distribution tracks, fixing devices or further encapsulation layers, are in each case not shown for simplification of the diagram.

FIGS. 2A to 2D show diagrams of further exemplified embodiments for the substrate electrode 38. In this context the scattering particles 31 and the conductive particles 32 are only indicated. According to FIG. 2A the grid structure 8, seen in cross-section, is rectangular in shape. In contrast to that shown in FIG. 2A, the grid structure 8 preferably does not protrude over the particle layer 3, but ends flush with the particle layer 3.

Figure 2A:
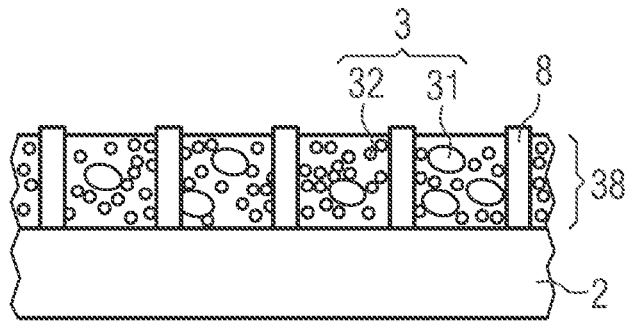
FIGS. 2A-2D show section diagrams of exemplified embodiments of substrate electrodes for organic light-emitting diodes.
Figure 2B:
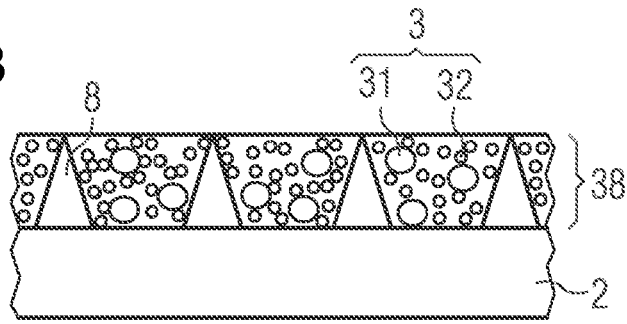
Figure 2C:
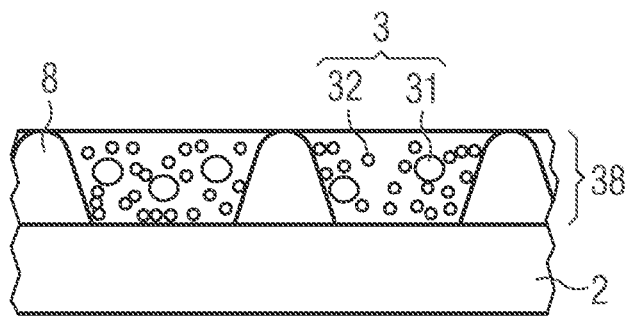

According to FIG. 2B the grid structure 8, seen in cross-section, is triangular in shape. FIG. 2C shows that the grid structure 8, seen in cross-section, is approximately parabolic in configuration. In particular such grid structures 8 as are shown in FIG. 2C can be produced via an ink jet printing method. The grid structures as shown in FIG. 2A are produced, for example, via photolithography.

Figure 2D:
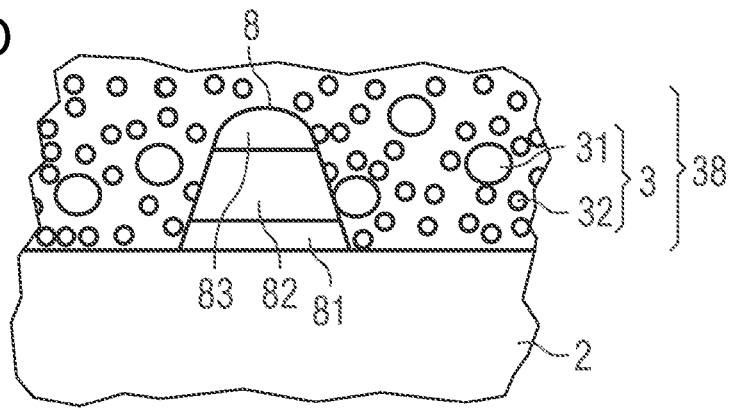

The grid structure 8 can, see FIG. 2D and as also possible in all other exemplified embodiments, be constructed in several layers. Between two adhesion promotion layers 81, 83 there is located a thicker current conduction layer 82. The layers 81, 82, 83 are formed, for example, by Cr, Al, Cr or by Mo, Al, Mo, it also being possible for the aluminium to be set by silver. Layer thicknesses of the layers 81, 82, 83 are, for example, 100 nm, 500 nm and 100 nm. The current conduction layer 82 here can also be thinner in configuration and, for example, have a thickness of only 300 nm.

In deviation from the diagram in FIG. 2D, the grid structure 8 can also be formed by a single layer, which comprises, for example, aluminium, silver, copper and/or gold or consists of these.

In the exemplified embodiment, as to be seen in FIG. 3, the particle layer 3 has two sublayers. The grid structure 8 is not shown, for simplification of the diagram in FIG. 3. The sublayers in FIG. 3 are separated from one another in diagram form by a dot-dash line. This separation into the sublayers, however, is fictitious and does not correspond to a real material boundary or material seam within the particle layer 3.

The first sublayer, which is located directly on the substrate upper side 20, has both the scattering particles 31 and the conductive particles 32. The second sublayer, which is located directly on the organic layer sequence 4, is formed exclusively or largely predominantly from the conductive particles 32. Since the conductive particles 32 have a lower average diameter, a flatter, less rough main side of the particle layer 3 on the organic layer sequence 4 can be realised by this division of the particle layer 3 into two sublayers.

For example, an average roughness of a main side of the particle layer 3 on the organic layer sequence 4 is relatively low and is approximately 15 nm. In comparison with this, a roughness of the substrate upper side 20 is in the range of from 5 nm to 10 nm. In other words, in spite of the particle structure in the particle layer 3 the average roughness on the surface on which the organic layer sequence 4 is applied is not increased significantly. Materials of the organic layer sequence 4 preferably penetrate only within the roughness of this main side of the particle layer 3 into the particle layer 3. Intermediate spaces between the conductive particles 32 and/or the scattering particles 31 are preferably evacuated, but can also be filled with an inert gas.

FIG. 4 shows a diagram of method steps for producing the organic light-emitting diode 1, wherein the grid structure 8 in turn is not shown for simplification of the diagram. According to FIG. 4A a solution 6 is applied to the substrate upper side 20.

The solution 6 comprises a solvent 60 or a mixture of several solvents. The scattering particles 31 and the conductive particles 32 are present in the solvent 60, preferably in homogeneous distribution. In order to stabilise the particles 31, 32 in the solvent 60 and in order to prevent an agglomeration in particular of the conductive particles 32, the scattering particles 31 and/or the conductive particles 32 can be provided with an organic envelope. In the finished particle layer 3 this organic envelope, which optionally can also be present in all other exemplified embodiments, has no function. In particular, this organic envelope does not act as a binder between the particles and also not as an electrically conductive medium or as a light scattering constituent. Organic materials accordingly also have only a very low weight content in the finished particle layer.

FIG. 4B shows the resulting particle layer 3. The solvent 60 preferably evaporates without residue and completely, so that the densely packed particle layer 3 is formed.

Figure 5:
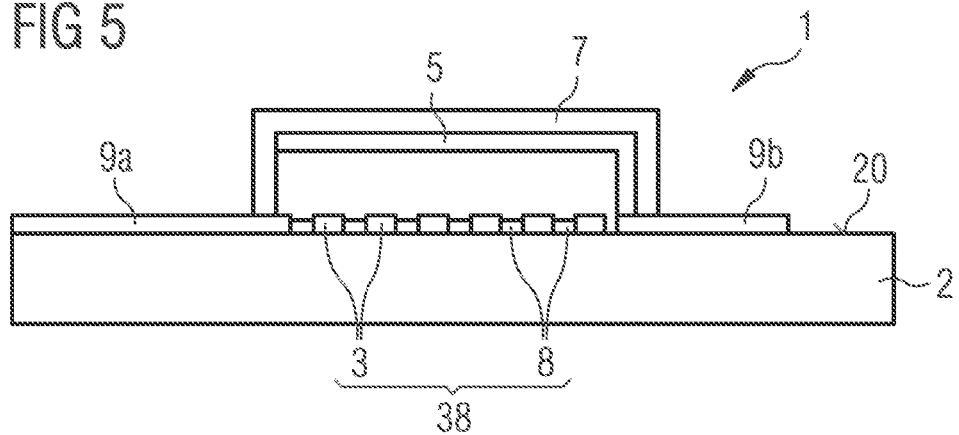

FIG. 5 shows a further exemplified embodiment of the organic light-emitting diode 1. The encapsulation layer 7 in this context partially covers the contact surfaces 9a, 9b. Seen in cross-section, the encapsulation layer 7 is U-shaped in configuration.

Figure 6:
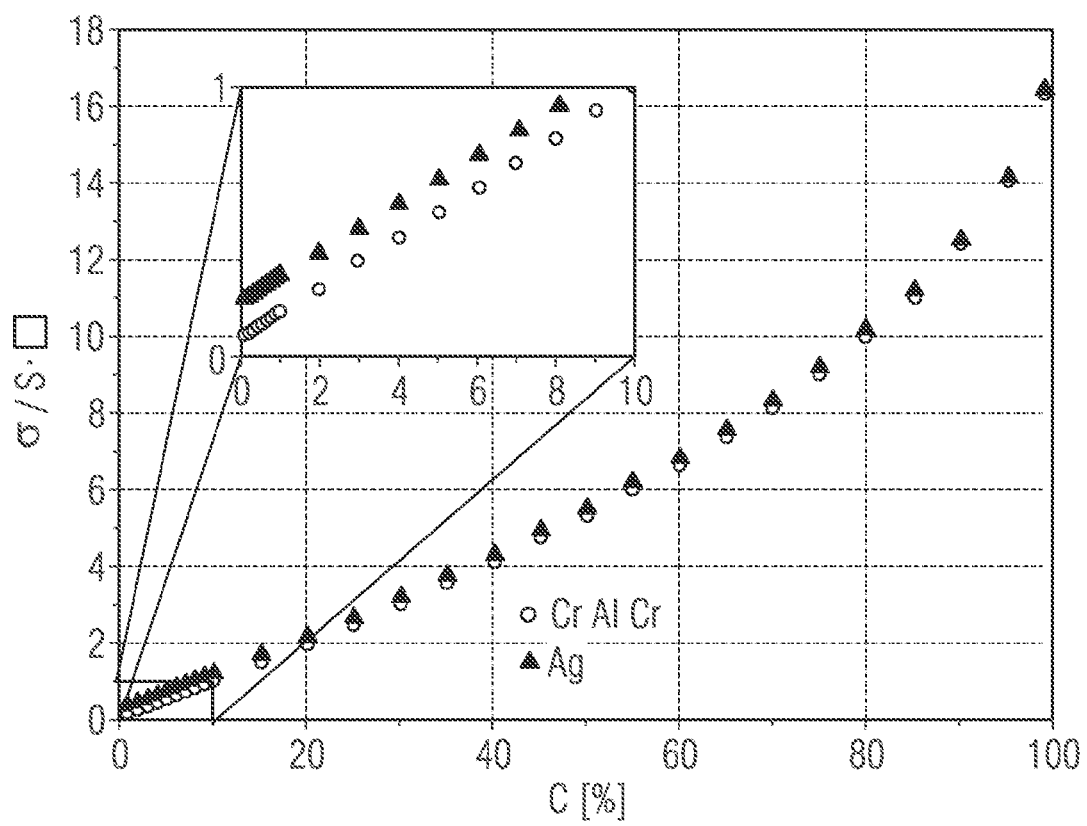
FIGS. 6 and 7 show diagrams of an electrical surface conductivity of substrate electrodes for organic light-emitting diodes.
Figure 7:
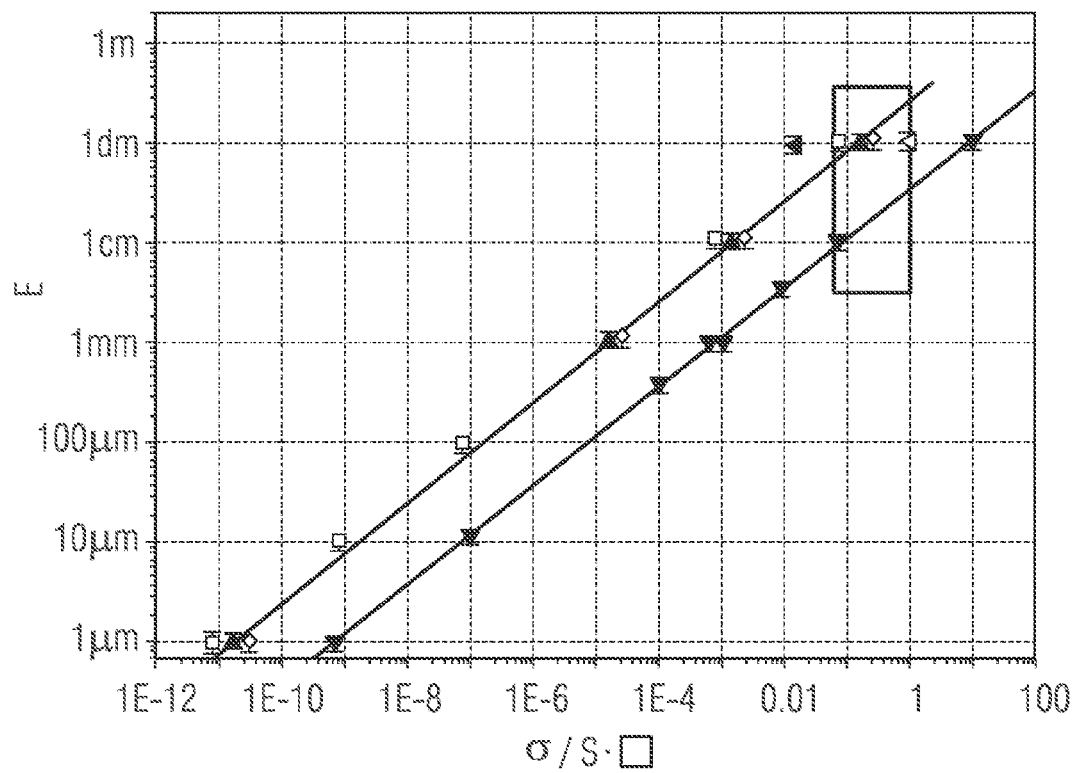

In FIG. 6 a degree of covering C is plotted against a surface conductivity σ, in FIG. 7 the surface conductivity σ is plotted against a mesh width E of the grid structure 8.

The surface conductivity σ increases approximately linearly at low degrees of covering C. Preferred surface conductivities G are achieved at degrees of covering C of a few ten percent. Preferably, the degree of covering C is approximately 30%.

In the log-log plot of FIG. 7 it can be seen that the surface conductivity σ depends on the mesh width E. Particularly preferred ranges for the mesh width E are in the range of from 0.5 mm to 1 mm.

Depending on a size of the organic light-emitting diode 1, which can have edge lengths in the region of several decimeters, the desired surface conductivity G can be established in a targeted manner by the parameters of mesh width E, thickness d of the substrate electrode 38, thickness of the grid structure 8 and materials of the substrate electrode 38, for example, with the aid of FIGS. 6 and/or 7, in order to achieve a higher efficiency.

The invention described here is not limited by the description with the aid of the exemplified embodiments. Rather, the invention includes any novel feature and any combination of features, which in particular includes any combination of features in the claims, even if this feature or this combination itself is not described explicitly in the claims or exemplified embodiments.

The invention claimed is:
1. An organic light-emitting diode comprising:
a substrate having a substrate upper side;
an electrically conductive grid structure located on the substrate upper side for a current distribution;
an electrically conductive particle layer located at the substrate upper side and in which the grid structure is embedded;
an organic layer sequence located directly on the particle layer; and
a covering electrode attached to the organic layer sequence,
wherein the particle layer comprises scattering particles having a first average diameter and electrically conductive particles having a smaller second average diameter,
wherein the scattering particles are packed together with the conductive particles,
wherein the particle layer together with the grid structure form a substrate electrode for the organic layer sequence,
wherein the conductive particles, but not the scattering particles, are percolated in the particle layer, and
wherein the light-emitting diode emits light only through the particle layer and the substrate when operated as intended.

2. The organic light-emitting diode according to claim 1, wherein the grid structure and the particle layer end flush with one another in a direction away from the substrate upper side so that the grid structure and the particle layer taken together form a flat surface on which the organic layer sequence is located.

3. The organic light-emitting diode according to claim 1, wherein the particle layer protrudes over and completely covers the grid structure in a direction away from the substrate upper side so that the particle layer forms a flat surface on which the organic layer sequence is located.

4. The organic light-emitting diode according to claim 1, wherein the particle layer and the grid structure have the same thickness, with a tolerance of at most 30% of a thickness of the grid structure.

5. The organic light-emitting diode according to claim 1, wherein a degree of covering of the substrate upper side by the grid structure is between 3% and 30% inclusive, and wherein the grid structure comprises one or more metallic layers.

6. The organic light-emitting diode according to claim 1, wherein the grid structure has an average linear width of between 10 µm and 200 µm inclusive, wherein an average mesh width of the grid structure is between 0.1 mm and 3 mm inclusive and a thickness of the grid structure is at least 200 nm and at most 10 µm, and wherein the grid structure is formed by a regular triangular, rectangular or hexagonal pattern.

7. The organic light-emitting diode according to claim 1, wherein crosspieces of the grid structure, seen in cross-section, have a rectangular, triangular, trapezoidal or parabolic configuration.

8. The organic light-emitting diode according to claim 1, wherein a surface conductivity of the substrate electrode is between 1 S·☐ and 10 S·☐ inclusive, and wherein an emitting surface of the organic light-emitting diode is at least $0.01 \times 0.01$ m² and at most $1 \times 1$ m².

9. The organic light-emitting diode according to claim 1, wherein the grid structure and the particle layer are each directly located at the substrate upper side, wherein the particle layer comprises the scattering particles and the conductive particles, and wherein the average diameter of the scattering particles is between 100 nm and 400 nm inclusive and the average diameter of the conductive particles is between 5 nm and 50 nm inclusive.

10. The organic light-emitting diode according to claim 1, wherein the particle layer in a first sublayer directly on the substrate upper side has a higher concentration of scattering particles than in a second sublayer directly on the organic layer sequence, wherein the first and second sublayers are immediately adjacent to one another and the concentrations of scattering particles differ from one another by at least a factor of 3, and wherein the scattering particles are electrically insulating.

11. The organic light-emitting diode according to claim 1, wherein the particle layer comprises inorganic materials to an extent of at least 90% by weight and is free from a matrix material for the scattering particles or the conductive particles, wherein the covering electrode is directly located at the organic layer sequence and is a metallic mirror, wherein the light-emitting diode appears milky-cloudy and whitish to an observer due to the particle layer when in a switched-off state, and wherein the light-emitting diode is equipped to generate visible light during operation.

12. A method for producing the organic light-emitting diode according to claim 1, the method comprising:
generating the grid structure on the substrate upper side of the substrate;
preparing a solution which comprises at least one solvent, the scattering particles and the conductive particles;
applying the solution to the substrate upper side so that the grid structure is embedded;
drying the solution by removing the solvent to provide the particle layer; and
applying the organic layer sequence to the particle layer.

13. The method according to claim 12, wherein the grid structure is produced photolithographically, and wherein the particle layer is printed on.

14. An organic light-emitting diode comprising:
a substrate having a substrate upper side;
an electrically conductive grid structure located on the substrate upper side for a current distribution;
an electrically conductive particle layer located at the substrate upper side and in which the grid structure is embedded so that the particle layer completely or partially covers the grid structure on side faces which are orientated transversely to the substrate upper side;
an organic layer sequence located directly on the particle layer; and
a covering electrode attached to the organic layer sequence,
wherein the particle layer comprises scattering particles having a first average diameter and electrically conductive particles having a smaller second average diameter,
wherein the particle layer is free from a matrix material,
wherein the scattering particles are packed together with the conductive particles, and
wherein the particle layer together with the grid structure form a substrate electrode for the organic layer sequence.

15. An organic light-emitting diode comprising:
a substrate having a substrate upper side;

an electrically conductive grid structure located on the substrate upper side for a current distribution;

an electrically conductive particle layer located at the substrate upper side and in which the grid structure is embedded;

an organic layer sequence located directly on the particle layer; and a covering electrode attached to the organic layer sequence, wherein the particle layer comprises scattering particles having a first average diameter and electrically conductive particles having a smaller second average diameter, wherein the scattering particles are packed together with the conductive particles, wherein the particle layer together with the grid structure form a substrate electrode for the organic layer sequence, wherein the particle layer comprises inorganic materials to an extent of at least 90% by weight and is free from a matrix material for the scattering particles or the conductive particles, wherein the covering electrode is directly located at the organic layer sequence and is a metallic mirror, wherein the light-emitting diode appears milky-cloudy and whitish to an observer due to the particle layer when in a switched-off state, and wherein the light-emitting diode is equipped to generate visible light during operation.

* * * * *